(12) United States Patent
Cui et al.

(10) Patent No.: US 12,053,995 B2
(45) Date of Patent: Aug. 6, 2024

(54) METHOD FOR PRINTING SILVER NANOWIRE HARNESS NETWORK STRUCTURE BY USING GLUE DISPENSER

(71) Applicant: Xi'an Jiaotong University, Shaanxi (CN)

(72) Inventors: Jianlei Cui, Shaanxi (CN); Chenchen Huang, Shaanxi (CN); Xuesong Mei, Shaanxi (CN); Zhengjie Fan, Shaanxi (CN); Wenjun Wang, Shaanxi (CN); Bin Liu, Shaanxi (CN); Wenqiang Duan, Shaanxi (CN); Jun Yang, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 710 days.

(21) Appl. No.: 17/236,696

(22) Filed: Apr. 21, 2021

(65) Prior Publication Data

US 2022/0080758 A1 Mar. 17, 2022

(30) Foreign Application Priority Data

Sep. 17, 2020 (CN) .......................... 202010982778.2

(51) Int. Cl.
*B41M 3/00* (2006.01)
*H05K 3/12* (2006.01)
(Continued)

(52) U.S. Cl.
CPC .......... *B41M 3/006* (2013.01); *H05K 3/1241* (2013.01); *B82Y 30/00* (2013.01); *B82Y 40/00* (2013.01);
(Continued)

(58) Field of Classification Search
CPC . H01B 1/02; H01B 1/22; H05K 1/028; H05K 1/0313; H05K 1/09; H05K 1/092;
(Continued)

(56) References Cited

U.S. PATENT DOCUMENTS 9,345,123 B2 * 5/2016 Yang .................... H05K 1/02
2016/0029475 A1 * 1/2016 Hwang ................. H05K 1/097
427/532

FOREIGN PATENT DOCUMENTS

CN 103700446 A * 4/2014
KR 102466098 B1 * 7/2022 ........... C12N 5/0698

OTHER PUBLICATIONS

R. Morent et al., "Effects of operating parameters on plasma-induced-PET surface treatment," Nucl. Instr. and Meth. in Phys. Res. B 266 (2008) 3081-3085. (Year: 2008).*

(Continued)

*Primary Examiner* — William P Fletcher, III
(74) *Attorney, Agent, or Firm* — Tarolli, Sundheim, Covell & Tummino LLP

(57) ABSTRACT

Disclosed is a method for printing a silver nanowire harness network structure by using a glue dispenser, including the following: 1) constructing an induced PET substrate: modifying a PET substrate by a surface hydrophobic treatment method to enhance the binding force between nanowires and the PET substrate and enhance the conductivity of a nanowire network structure; 2) constructing a glue dispensing printing system and printing the nanowire harness network structure: fixing the glue dispenser to a worktable, fixing a printed PET substrate to a ufab three-dimensional moving platform for controlling the movement of the PET substrate, adjusting the moving speed of the ufab three-dimensional moving platform and the distance between a needle head and the PET substrate, controlling the glue dispensing air pressure and the glue dispensing amount of silver nanowire glue (Continued)

by the glue dispenser, and obtaining the nanowire harness network structure on the PET substrate.

4 Claims, 3 Drawing Sheets

(51) Int. Cl.
 *B82Y 30/00* (2011.01)
 *B82Y 40/00* (2011.01)
 *H05K 1/09* (2006.01)
(52) U.S. Cl.
 CPC ........... *H05K 1/097* (2013.01); *H05K 3/1208* (2013.01); *H05K 2203/1173* (2013.01)
(58) Field of Classification Search
 CPC .......... H05K 1/11; H05K 1/118; H05K 1/189; H05K 3/10; H05K 3/103; H05K 3/108; H05K 3/1275; H05K 3/381; H05K 7/02
 See application file for complete search history.

(56) References Cited

OTHER PUBLICATIONS

Cui et al., "Electrohydrodynamic printing of silver nanowires for flexible and stretchable electronics," Nanoscale, 2018, 10, 6806-6811. (Year: 2018).*
Harness. Oxford English Dictionary. Retrieved from https://www.oed.com/dictionary/harness_n?tab=meaning_and_use#2083124 on Feb. 8, 2024. (Year: 2024).*
U-FAB product information sheet from CLECELL. Retrieved from https://www.clecell.co.kr/pdf/U-FAB%20MASTER(ENG).pdf on Feb. 8, 2024. (Year: 2020).*

* cited by examiner

METHOD FOR PRINTING SILVER NANOWIRE HARNESS NETWORK STRUCTURE BY USING GLUE DISPENSER

RELATED APPLICATIONS

The present invention is a Nonprovisional Application under 35 USC 111(a), claiming priority to Serial No. CN 202010982778.2, filed on 17 Sep. 2020, the entirety of which is incorporated herein by reference.

TECHNICAL FIELD

The present disclosure belongs to the technical field of silver nanowire harness networked arrangement, and particularly, relates to a method for printing a silver nanowire harness network structure by using a glue dispenser.

BACKGROUND

At present, silver nanowires have very important applications in the field of transparent conductive films due to excellent transparency brought by a size effect and high conductivity brought by high free electron density. However, it is very difficult to arrange and operate materials in nanoscale, so the nanowire network arrangement technology has become a research hotspot in nano manufacturing technology. At present, silver nanowires are directly prepared into films in most of the methods using silver nanowires, such as a vacuum filtration method, a drop coating method, a spin coating method, a spraying method, a roll to roll coating method. Most of the nanowires in the silver nanowire films prepared by these methods are disordered, and there will be great contact resistance among these disordered nanowires, which will greatly affect the conductivity of the arranged nanowire films, thereby making the advantages of the original silver nanowires with high conductivity become negligible. Therefore, there are special equipment, such as ink-jet printers and 3D printers, for arranging the nanowires, which are easy to operate and do not need to be positioned repeatedly. The conductivity of the arranged nanowires is good. The conductivity of the nanowires are better than that of the films formed directly no matter they are directly used or connected at a high temperature after being printed.

Although the current ink-jet printers and 3D printers are very mature, their prices are relatively high.

SUMMARY

The objective of the present disclosure is to provide a method for printing a silver nanowire harness network structure by using a glue dispenser. The method does not need accurate positioning, and has a simple process and high printing efficiency.

The present disclosure is implemented by adopting the following technical solutions:

A method for printing a silver nanowire harness network structure by using a glue dispenser includes the following steps:

1) constructing an induced PET substrate: modifying a PET substrate by a surface hydrophobic treatment method, so as to enhance the binding force between nanowires and the PET substrate and further enhance the conductivity of a nanowire network structure;

2) constructing a glue dispensing printing system and printing the nanowire harness network structure: fixing the glue dispenser to a worktable, fixing a printed PET substrate to a ufab three-dimensional moving platform for controlling the movement of the PET substrate, adjusting the moving speed of the ufab three-dimensional moving platform and the distance between a needle head and the PET substrate by a computer, controlling the glue dispensing air pressure and the glue dispensing amount of silver nanowire glue by the glue dispenser, and finally, obtaining the nanowire harness network structure on the PET substrate.

Further improvement of the present disclosure is that preparation steps of the silver nanowire glue are as follows:

mixing a silver nanowire solution with the Ag concentration of 10 mg/ml and polyvinylpyrrolidone powder according to the mass ratio of 1:20 to 30, and stirring uniformly to obtain the silver nanowire glue.

Further improvement of the present disclosure is that the purity of the silver nanowire solution is greater than 99 wt %, and the solvent thereof is water, ethanol or isopropyl alcohol.

Further improvement of the present disclosure is that a magneton stirrer is used for mixing, the stirring speed is 500 to 510 r/min, and the stirring time is 30 to 35 minutes.

Further improvement of the present disclosure is that a specific process of constructing the induced PET substrate in step 1) is as follows: performing surface hydrophobic treatment on the PET substrate, and standing for 30 to 35 minutes after the surface hydrophobic treatment is performed for 20 to 25 seconds to complete the treatment of the PET substrate.

Further improvement of the present disclosure is that a specific implementation method of step 2) is as follows:

a. fixing the ufab three-dimensional moving platform, suspending a needle head loaded with the silver nanowire glue right above the ufab three-dimensional moving platform, and fixing the treated PET substrate to the ufab three-dimensional moving platform by using an adhesive tape;

b. controlling the movement of the z-axle and determining zero positions, where the distance between the needle head and the PET substrate is zero, of the needle head and the PET substrate by a computer;

c. adjusting the moving speed of the x-axle and the y-axle, where after repeated tests, a good wire shape can be obtained at the viscosity when the moving speed of the ufab three-dimensional moving platform is 20 to 25 mm/s, the printing distance should be controlled between 0.5 and 1 mm, the glue dispensing air pressure is controlled between 20 and 25 kpa, and the glue dispensing mode is a mode of printing by pressing down a switch and stopping printing after the switch is released;

d. pressing down the printing switch before the PET substrate starts moving, printing in advance, then moving the PET substrate, and finally, printing out the nanowire harness network structure.

The present disclosure at least has the following beneficial technical effects:

The present disclosure prepares the nanowire harness network structure by using the glue dispenser, which saves the cost of directly coupling a nanowire harness network structure printing device and the ufab three-dimensional moving platform. A silver nanowire harness network structure with a well retained structure is prepared through reasonable parameter setting and preparation of the silver nanowire glue. The present disclosure is simple in operation, low in preparation cost, and can be used on a large scale.

DETAILED DESCRIPTION

Figure 1:
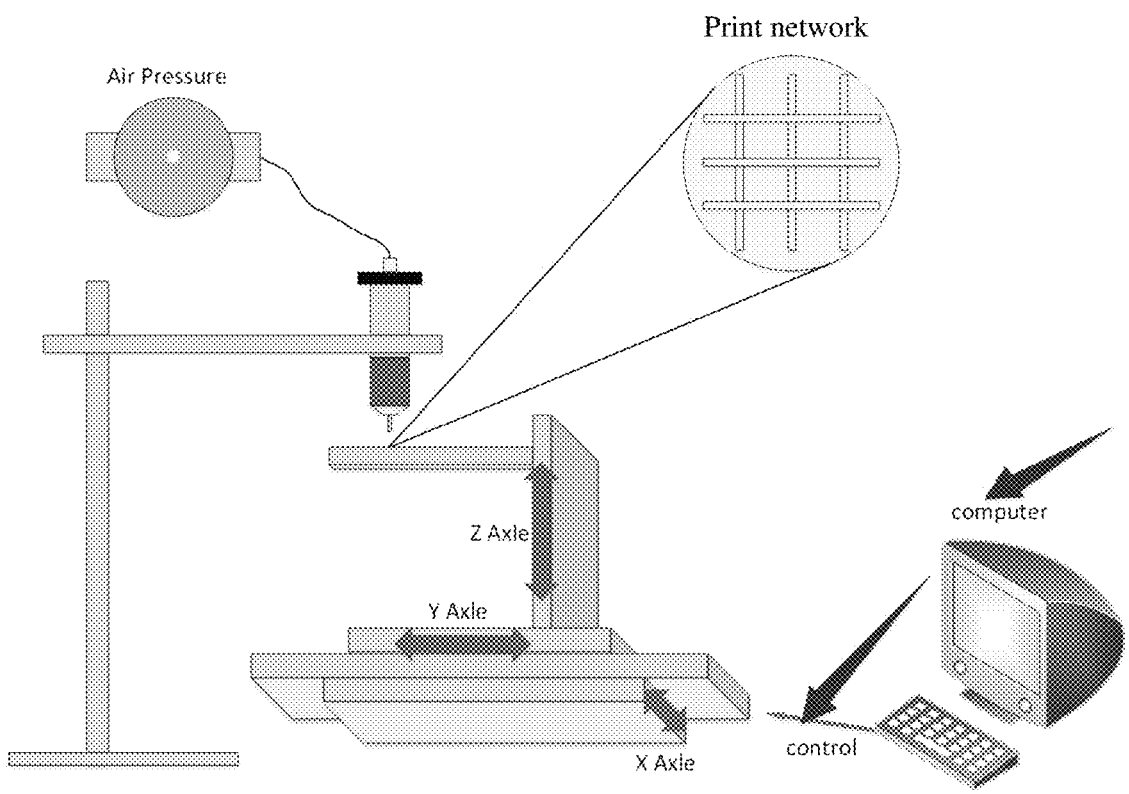
FIG. 1 is a diagram of a glue dispensing printing system adopted by the embodiments of the present disclosure.

The present disclosure is further described below with reference to the accompanying drawings and embodiments.

A method for printing a silver nanowire harness network structure by using a glue dispenser includes the following steps:
1) preparing a silver nanowire solution with appropriate viscosity: mixing a silver nanowire solution which takes alcohol as a solvent and Polyvinylpyrrolidine (PVP), and adjusting the viscosity of the solution to obtain the silver nanowire glue used for printing;
2) constructing an induced PET substrate: modifying a PET substrate by a surface hydrophobic treatment method, so as to enhance the binding force between nanowires and the PET substrate and further enhance the conductivity of a nanowire network structure;
3) constructing a glue dispensing printing system and printing the nanowire harness network structure: fixing the glue dispenser to a worktable, fixing a printed PET substrate to a ufab three-dimensional moving platform for controlling the movement of the PET substrate, connecting the ufab three-dimensional moving platform through a computer, adjusting the moving speed of the ufab three-dimensional moving platform and the distance between a needle head and the PET substrate, and controlling the glue dispensing air pressure and the glue dispensing amount by the glue dispenser, and finally printing to obtain the nanowire harness network structure.

Specific steps for preparing the silver nanowire solution with appropriate viscosity in step 1) are as follows: adding 5 to 10 mL solution with the Ag contraction of 10 mg/mL into a beaker, where the purity is greater than 99 wt %, and the solvent is water, ethanol, or isopropanol. In order to enhance the viscosity of the solution to prepare printing glue, 1.5 to 3 g PVP powder is weighed by a weighing device, and then a magneton stirrer is used for mixing, where the stirring speed is 500 to 520 r/min, and the stirring time is 30 to 35 minutes.

A specific process of constructing the induced PET substrate of step 2) is that: the untreated PET substrate has a smooth surface and has poor binding force with glue, so it is necessary to perform surface hydrophobic treatment on the PET substrate. After the surface hydrophobic treatment is performed for 20 to 25 seconds, the PET substrate is subjected to standing for 30 to 35 minutes to complete the treatment of the PET substrate.

A specific process of constructing a glue dispensing printing system and printing the nanowire harness network structure of step 3) is as follows:
a. fixing the ufab three-dimensional moving platform, suspending a needle head loaded with the silver nanowire glue right above the ufab three-dimensional moving platform, and fixing the treated PET substrate to the ufab three-dimensional moving platform;
b. controlling the movement of the z-axle and determining zero positions, where the distance between the needle head and the PET substrate is zero, of the needle head and the PET substrate is zero by the computer;
c. adjusting the moving speed of the x-axle and the y-axle, where after repeated tests, a good wire shape can be obtained at the viscosity when the moving speed of the ufab three-dimensional moving platform is 20 to 25 mm/s; the printing distance should be controlled between 0.5 and 1 mm; the glue dispensing air pressure should be controlled between 20 and 25 kpa; the glue dispensing mode is a mode of printing by pressing down a switch and stopping printing after the switch is released;
d. the used silver nanowire glue has certain viscosity, where at the beginning of printing, the silver nanowire glue cannot be printed on the PET substrate immediately, so it is necessary to press down a printing switch for printing in advance before the PET substrate starts moving, then the PET substrate is moved, and finally, the nanowire harness network structure is finally printed.

Embodiment 1

A method for printing a silver nanowire harness network structure by using a glue dispenser provided by the present disclosure includes the following steps that:
1) A silver nanowire solution with appropriate viscosity is prepared: 5 mL solution with the Ag concentration of 10 mg/mL is added into a beaker, where the purity is greater than 99 wt %, and the solvent is water, ethanol, or isopropanol. In order to enhance the viscosity of the solution to prepare printing silver nanowire glue, 1.5 g PVP powder is weighed by a weighing device, and then a magneton stirrer is used for mixing. The stirring speed is 500 r/min, and the stirring time is 30 minutes.
2) The induced PET substrate is constructed: the untreated PET substrate has a smooth surface and has poor binding force with glue, so it is necessary to perform surface hydrophobic treatment on the PET substrate. After the surface hydrophobic treatment is performed for 20 seconds, the PET substrate is subjected to standing for 30 minutes to complete the treatment of the PET substrate.
3) The glue dispensing printing system is constructed and the nanowire harness network structure is printed: first, the ufab three-dimensional moving platform is fixed, then, a needle head loaded with the silver nanowire glue is suspended right above the ufab three-dimensional moving platform, and the treated PET substrate is fixed to the ufab three-dimensional moving platform, the z-axle is controlled to move and the positions, where the distance between the needle head and the PET substrate is zero, of the needle head and the PET substrate are determined by a computer. The moving speed of the x-axle and the y-axle are adjusted, where the moving speed of the ufab three-dimensional moving platform is 25 mm/s, the printing distance is 1 mm, and the glue dispensing air pressure is 20 kpa. The glue dispensing mode is a mode of printing by pressing down a switch and stopping printing after the switch is released. The used silver nanowire glue has certain viscosity, so at the beginning of printing, the silver nanowire glue cannot be printed on the PET substrate immediately. Therefore, it is necessary to press down the printing switch for printing in advance before the PET substrate starts moving, then the PET substrate is moved, and finally, the nanowire harness network structure is finally printed out.

Figure 2:
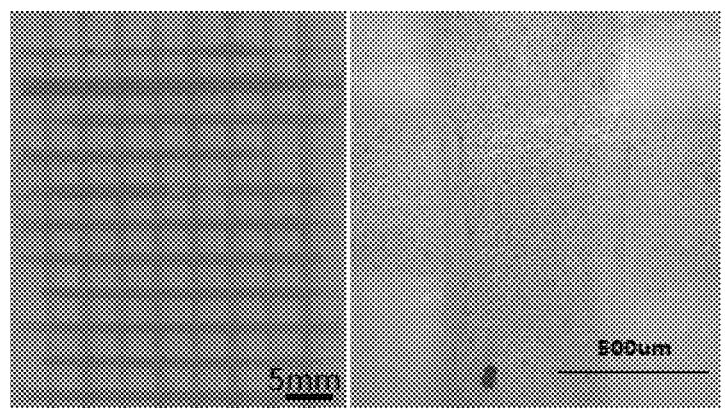
FIG. 2 is a silver nanowire hardness network structure obtained in Embodiment 1 and a partial enlarged drawing, and FIG. 2(*b*) is a local enlarged drawing of FIG. 2(*a*).

The embodiment of the present disclosure has the beneficial effects that: referring to FIG. 2, the silver nanowire harness network structure is formed under the constructed glue dispenser printing system of the present embodiment. The network wire shape structure is complete.

Embodiment 2

Figure 3:
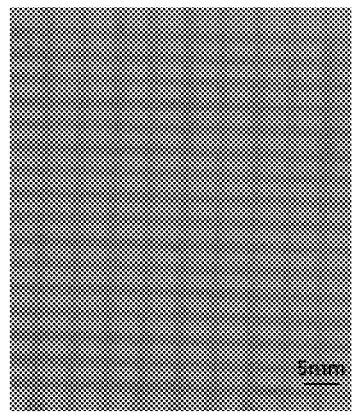
FIG. 3 is a silver nanowire hardness network structure obtained in Embodiment 2.

The step 3) of Embodiment 1 is adjusted as follows: the moving speed of the ufab three-dimensional moving platform is 25 mm/s, and the printing distance is 1 mm, the glue dispensing air pressure is 25 kpa and the sequence and parameters of other steps are unchanged, so that a silver nanowire harness network structure with thinner wire shape can be obtained, referring to FIG. 3.

Embodiment 3

Figure 4:
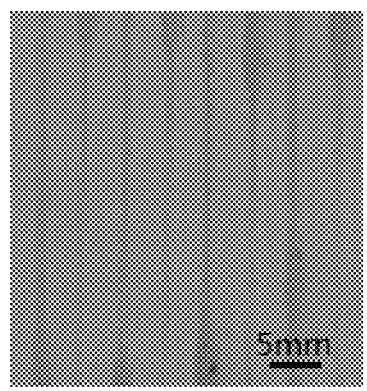
FIG. 4 is a silver nanowire hardness network structure obtained in Embodiment 3.

The step 3) of Embodiment 1 is adjusted as follows: the moving speed of the ufab three-dimensional moving platform is 22 mm/s, and the printing distance is 1 mm, the glue dispensing air pressure is 20 kpa, and the sequence and parameters of other steps are unchanged, so that a silver nanowire harness network structure with the thinnest wire shape can be obtained, referring to FIG. 4.

Embodiment 4

Figure 5:
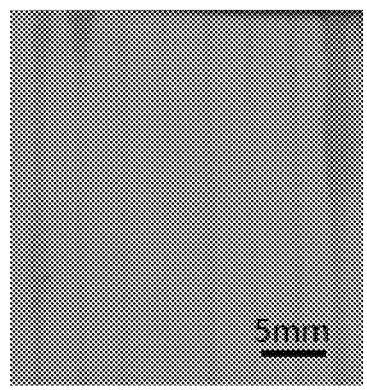
FIG. 5 is a silver nanowire hardness network structure obtained in Embodiment 4.

The step 3) of Embodiment 1 is adjusted as follows: the moving speed of the ufab three-dimensional moving platform is 20 mm/s, and the printing distance is 1 mm, the glue dispensing air pressure is 20 kpa and the sequence and parameters of other steps are unchanged, so that a silver nanowire harness network structure with the thinnest wire shape can be obtained, referring to FIG. 5.

Embodiment 5

Figure 6:
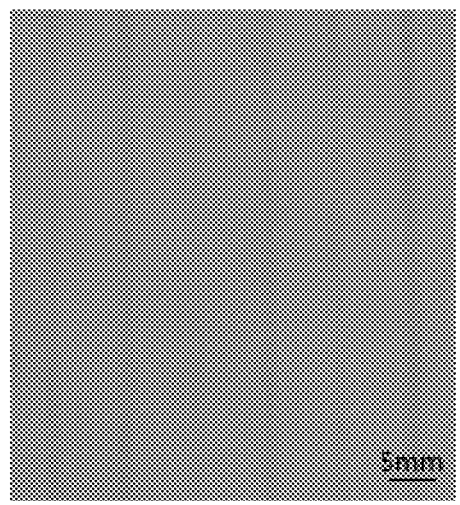
FIG. 6 is a silver nanowire hardness network structure obtained in Embodiment 5.

The step 3) of Embodiment 1 is adjusted as follows: the moving speed of the ufab three-dimensional moving platform is 20 mm/s, and the printing distance is 0.5 mm, the glue dispensing air pressure is 20 kpa and the sequence and parameters of other steps are unchanged, so that a silver nanowire harness network structure with the thinnest wire shape can be obtained, referring to FIG. 6.

What is claimed is:

1. A method for printing a silver nanowire network structure by using an ink dispenser, comprising the following steps:

1) performing a surface hydrophobic treatment on a PET substrate for 20 to 25 seconds, and allowing the treated PET substrate to stand for 30 to 35 minutes after the surface hydrophobic treatment is performed to complete the treatment of the PET substrate, so as to enhance a binding force between nanowires and the PET substrate and further enhance conductivity of the nanowire network structure;

2) Constructing an ink dispensing printing system and printing the nanowire network structure, comprising:
   a. fixing a three-dimensional moving platform, suspending a needle head loaded with silver nanowire ink above the three-dimensional moving platform, and fixing the treated PET substrate to the three-dimensional moving platform by using an adhesive tape;
   b. controlling, by a computer, movement of a z-axis, and determining, by the computer, zero positions of the needle head and the treated PET substrate, wherein the zero positions are positions where a distance between the needle head and the treated PET substrate is zero;
   c. adjusting a moving speed of an x-axis and a y-axis for multiple times, wherein a good wire shape can be obtained at a viscosity when the moving speed of the three-dimensional moving platform is 20 to 25 mm/s, a printing distance is required to be controlled between 0.5 and 1 mm, a ink dispensing air pressure is controlled between 20 and 25 kpa, and a ink dispensing mode is a mode of printing by pressing down a printing switch and stopping printing after the printing switch is released; and
   d. pressing down the printing switch for preprinting before the treated PET substrate starts moving, then moving the treated PET substrate, and printing out the nanowire network structure.

2. The method for printing the silver nanowire network structure by using the ink dispenser according to claim 1, wherein preparation steps of the silver nanowire ink comprises:

mixing a silver nanowire solution with an Ag concentration of 10 mg/ml and polyvinylpyrrolidone powder according to the mass ratio with a range of 1:20 to 1:30, and stirring uniformly to obtain the silver nanowire ink.

3. The method for printing the silver nanowire network structure by using the ink dispenser according to claim 2, wherein the purity of the silver nanowire solution is greater than 99 wt %, and the solvent thereof is water, ethanol, or isopropyl alcohol.

4. The method for printing the silver nanowire network structure by using the ink dispenser according to claim 2, wherein a magnetic stirrer is used for mixing, the stirring speed is 500 to 510 r/min, and the stirring time is 30 to 35 minutes.

* * * * *